United States Patent [19]

Engel

[11] 4,388,147

[45] Jun. 14, 1983

[54] METHOD FOR STEAM LEACHING PHOSPHORUS FROM PHOSPHOSILICATE GLASS DURING SEMICONDUCTOR FABRICATION

[75] Inventor: Paul R. Engel, Aloha, Oreg.

[73] Assignee: Intel Corporation, Santa Clara, Calif.

[21] Appl. No.: 408,711

[22] Filed: Aug. 16, 1982

[51] Int. Cl.³ .................. B44C 1/22; C03C 15/00; C03C 25/06

[52] U.S. Cl. ................................ 156/646; 65/31; 148/191; 156/657; 156/663

[58] Field of Search .................. 65/31; 148/191; 156/646, 655, 663, 657, 662; 423/658.5

[56] References Cited

U.S. PATENT DOCUMENTS 3,810,791 5/1974 Kendall .................. 148/191 X
3,811,975 5/1974 VanLierop et al. .......... 156/663 X
3,881,944 5/1975 Beall et al. .................. 156/663 X

*Primary Examiner*—William A. Powell
*Attorney, Agent, or Firm*—Blakely, Sokoloff, Taylor & Zafman

[57] ABSTRACT

A process for reducing the concentration of phosphorus in phosphosilicate glass having particular application in semiconductor fabrication is disclosed. A steam environment is provided, the temperature and pressure of which is adjusted within a predetermined range. The semiconductor device is inserted and maintained within the environment for a given time. The exposure to the steam environment effectively leaches phosphorus from the glass. The device is removed from the steam environment once a desired quantity of phosphorus has been removed.

13 Claims, 8 Drawing Figures

METHOD FOR STEAM LEACHING PHOSPHORUS FROM PHOSPHOSILICATE GLASS DURING SEMICONDUCTOR FABRICATION

BACKGROUND OF THE INVENTION

1. Field

The present invention relates to the field of semiconductor fabrication, and more particularly, to the reduction of phosphorus levels in phosphosilicate glass.

2. Art Background

During the fabrication of a semiconductor device, a passivation layer of phosphosilicate glass (hereinafter "pyroglass") is provided over the surface of the device in order to protect and seal the circuit from the ambient environment. However, passages through this pyroglass layer must be provided in order to permit package bonding leads and other metallization lines to be defined on, or electrically coupled to, portions of the semiconductor's surface.

In order to provide reliable metallization contacts through the passages in the pyroglass layer, the edges defining the passages must be smooth and without sharp corners which may interfere with the deposition of metal lines or the like on the semiconductor surface. As will be discussed, the formation of the pyroglass passages comprises as well as the smoothing process comprises a variety of well known steps. It has been found that if the pyroglass layer is provided with a higher concentration of phosphorus, smoother contact edges can be obtained with less crazing or cracking of the material during heating phases. Thus, greater device yields may be realized by increasing the phosphorus content of the pyroglass during the fabrication process.

However, the presence of any significant quantity of phosphorus in the pyroglass layer after the final packaging of the semiconductor device may promote corrosion problems. The phosphorus may combine with water within the semiconductor package cavity and form phosphoric acid. The presence of phosphoric acid within the package has been found to etch the aluminum bonding wires and pads, coupling the semiconductor device to the outside environment, thereby promoting failure and a shorter product life.

Accordingly, there exists a need to provide a means whereby the phosphorus content of the pyroglass layer may be lowered to preclude the subsequent formation of phosphoric acid within the semiconductor package. As will be described, the present invention reduces the phosphorus content of the pyroglass layer after the high phosphorus content in the pyroglass is no longer required during the manufacture of the circuit.

SUMMARY OF THE INVENTION

A process for reducing the concentration of phosphorus in phosphosilicate glass ("pyroglass") having particular application in semiconductor fabrication is disclosed. The semiconductor device is manufactured using common high temperature steps, such as the deposition of a pyroglass layer on the device, surface preparation and annealing steps. A steam environment is provided, the temperature and pressure of which is adjusted within a predetermined range. The semiconductor device is inserted and maintained within the steam environment for a given time. The exposure to the steam environment effectively leaches phosphorus from the pyroglass layer, thereby lowering the phosphorus concentration in the pyroglass and effectively precluding the subsequent formation of phosphoric acid within the semiconductor package cavity. The device is removed from the steam environment once a desired quantity of phosphorus has been leached from the pyroglass. Final low temperature processing steps are then accomplished in order to complete the fabrication of the semiconductor device, as is commonly done in the art.

DETAILED DESCRIPTION OF THE INVENTION

A process for reducing the concentration of phosphorus in phosphosilicate glass having particular application in semiconductor fabrication is disclosed. In the following description for purposes of explanation, specific numbers, times, pressures, temperatures, etc. are set forth in order to provide a thorough understanding of the present invention. However, it will be apparent to one skilled in the art that the present invention may be practiced without the specific details. In other instances, well-known processes are shown in block diagram form in order not to obscure the present invention unnecessarily.

Figure 1:
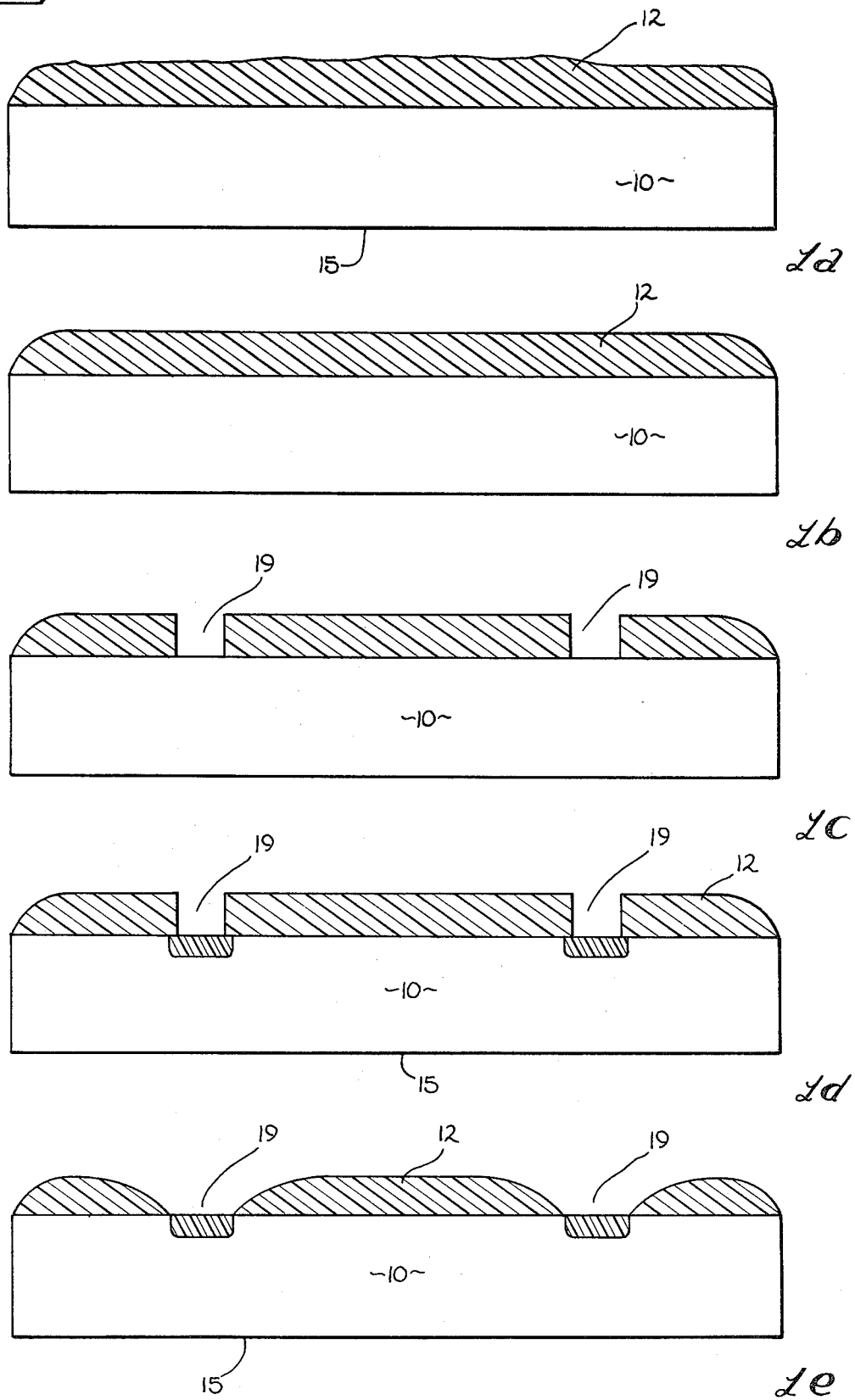
FIG. 1, (a)–(e) are cross-sectional views of a semiconductor device during various well-known fabrication steps.

Referring now to FIG. 1, typically during the manufacture of a semiconductor device 10 a layer of phosphosilicate glass ("pyroglass") 12 is deposited on the upper surface of the semiconductor device. The pyroglass 12 acts as a passivation layer for the device 10, and is generally 1–2 microns thick having an 8–10% by weight phosphorus content. As illustrated in FIG. 1(a), the layer 10 is initially relatively rough. Subsequent to the deposition of layer 12, a sequence of well known high temperature processing steps are effectuated, such as a "back getter" step in order to remove contaminents from the lower surface 15 of the device 10. A side effect of the backgetter step is the addition of phosphorus to the layer 12, such that the total concentration of phosphorus in the pyroglass layer is within the range of 10–12% by weight. This effect is due to the fact that the backgetter step involves heavy $POCl_3$ doping at 1000° C. and the pyroglass layer 12 is undensified.

In order to provide the required metalization lines and contact pads on the semiconductor device 10, appropriate passages 19 must be provided through pyroglass layer 12. Prior to the masking steps used to form the passages, the surface of pyroglass layer 12 is prepared using a high temperature "surface prep" step. The effect of the surface prep step (as shown in FIG. 1b) is to smooth the pyroglass layer 12 and reduce its phosphorus concentration back into the range of 9 to 10 percent. The purpose of the surface prep step is to provide better photoresist adhesion during the contact masking process. Traditionally, the surface prep step is accomplished in a steam environment at atmospheric pressure, with the temperature in the range of 950° to 1000° C.

The necessary passages for the contact pads and metalization lines are then defined on the semiconductor device 10 by the use of a photo-resist mask disposed over the pyroglass layer 12. Inasmuch as the masking operation utilized to define the required passages is well known in the art, it will be not be described further in this specification (see FIG. 1c).

Once the passages 19 have been defined through the pyroglass layer 12, a "plug getter" step is utilized which slightly increases the phosphorus concentration in the layer 12 to approximately 9.5 to 10% by weight. The plug getter cycle takes place at approximately 1000 degrees centigrade, and effectively dopes selective regions on the semi-conductor device 10 (see FIG. 1d) as is commonly done in the art.

In order to insure the proper metalization of the passages 19 will be achieved, it is necessary that the edges of the passages be smooth and not ragged or sharp. An annealing step (see FIG. 1e) is provided at 900° to 950° C. in a nitrogen atmosphere, which results in smooth contact passages. It has been found, that during the annealing phase smoother contact passages with less cracking or crazing of the pyroglass layer 12 is obtained if the phorphorus levelis maintained generally above 4–5%. Thus, in order to obtain satisfactory functional device yields it is desirable to maintain the phosphorus level in the pyroglass layer 12 sufficiently high through the annealing step, in order to prevent crazing and subsequent device failure. However, as previously discussed if the relatively high phosphorus concentration within the pyroglass layer 12 is maintained in a fully fabricated and packaged semiconductor device, corrosion problems will likely result through the formation of phosphoric acid within the cavity of the semiconductor package.

Figure 2:
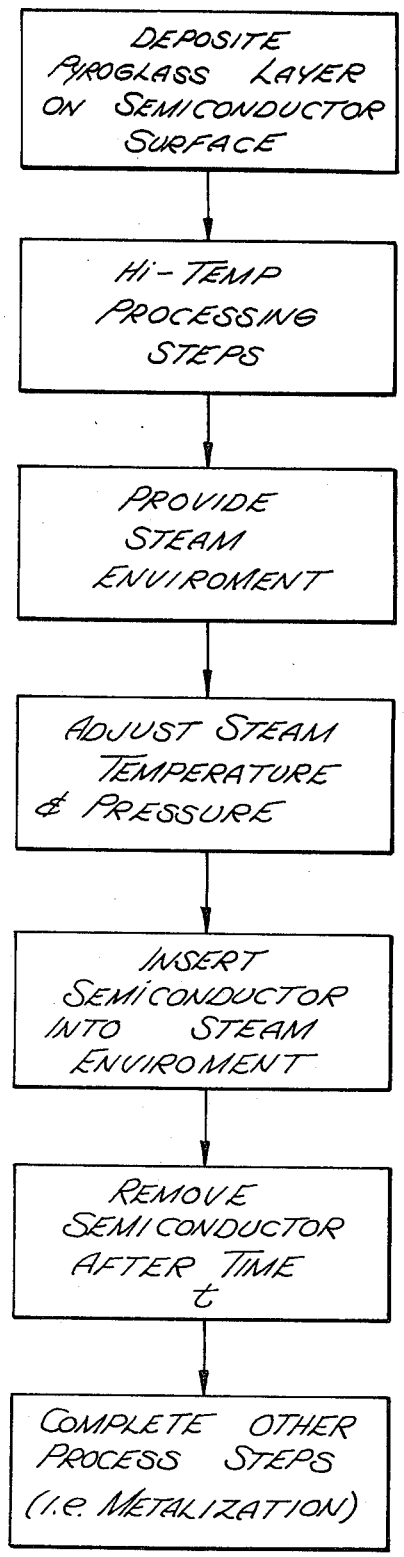
FIG. 2 is a block diagram symbolically illustrating the sequence of steps which are utilized by the present invention.

With reference now to FIG. 2, the steps practiced by the present invention in order to reduce the phosphorus concentration in the pyroglass layer 12 after the high temperature annealing and other steps have been completed will be disclosed. The present invention utilizes an effect of high temperature saturated steam on phosophorous in pyroglass films, preliminarily examined by Nagasima et al., "Interaction Between Phosphosilicate Glass Films and Water," *J. Electrochem. Soc.*, p. 439, March, 1974. As indicated in FIG. 2, after the above described high temperature processing steps have been accomplished, a steam environment is provided in which the temperature and pressure lie within a predetermined range. In the presently preferred embodiment, the temperature of the steam environment is adjusted such that it lies within the general range of 115° to 125° C. Similarly, the pressure of the environment is maintained generally in the range of 1.5–2.5 atm.

Figure 3A:
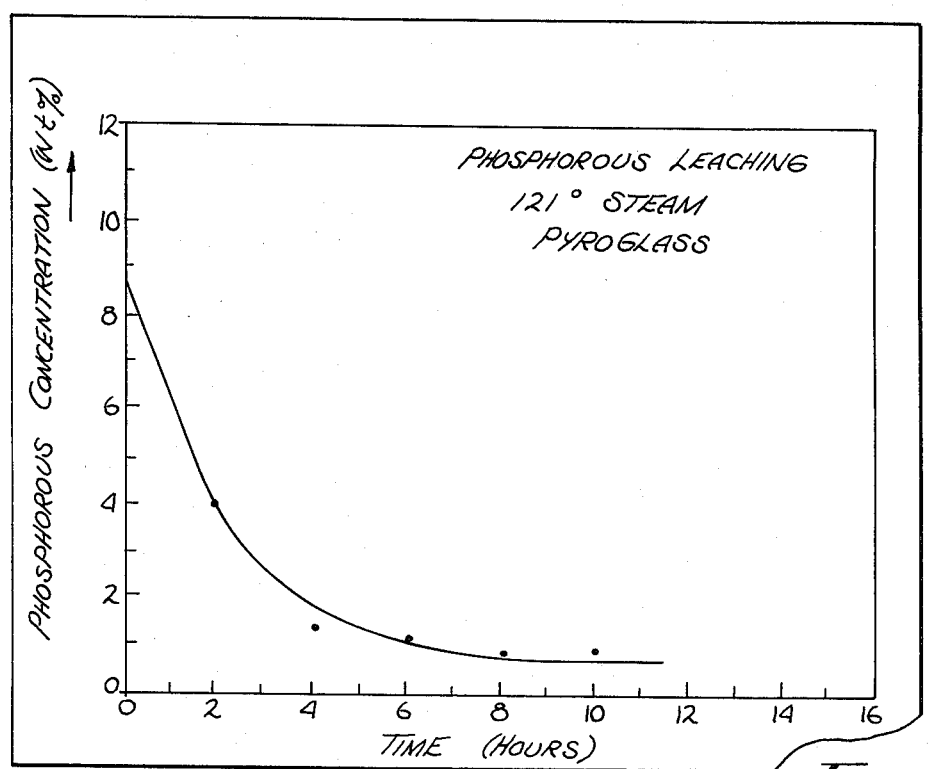
FIG. 3, (a)–(e) are graphs which illustrate the results of phorphorus leaching from phosphosilicate glass during experimental runs of the present invention.

The semiconductor device 10 is then inserted into this steam environment, which it has been found, effectively removes ("leaches") the phosphorus from the pyroglass layer 12. As best shown in FIG. 3a a relatively rapid loss of phosophorous occurs if undensified pyroglass is inserted into the above described steam environment. However, as shown in the remaining graphs of FIG. 3, the above mentioned high temperature processing steps, such as for example the backgetter, surface prep, plug-getter and annealing steps, have an effect on the rate in which phosophorous is removed from the pyroglass layer 12.

The data illustrated in FIG. 3 was obtained in a series of experiments. Six controlled semiconductor devices received no special processing. The remaining test devices were cut in half prior to the steam leach cycle in order to provide an additional control on machine variations and instabilities. The steam environment was maintained generally at 121° C. at 2 atm.

Figure 3B:
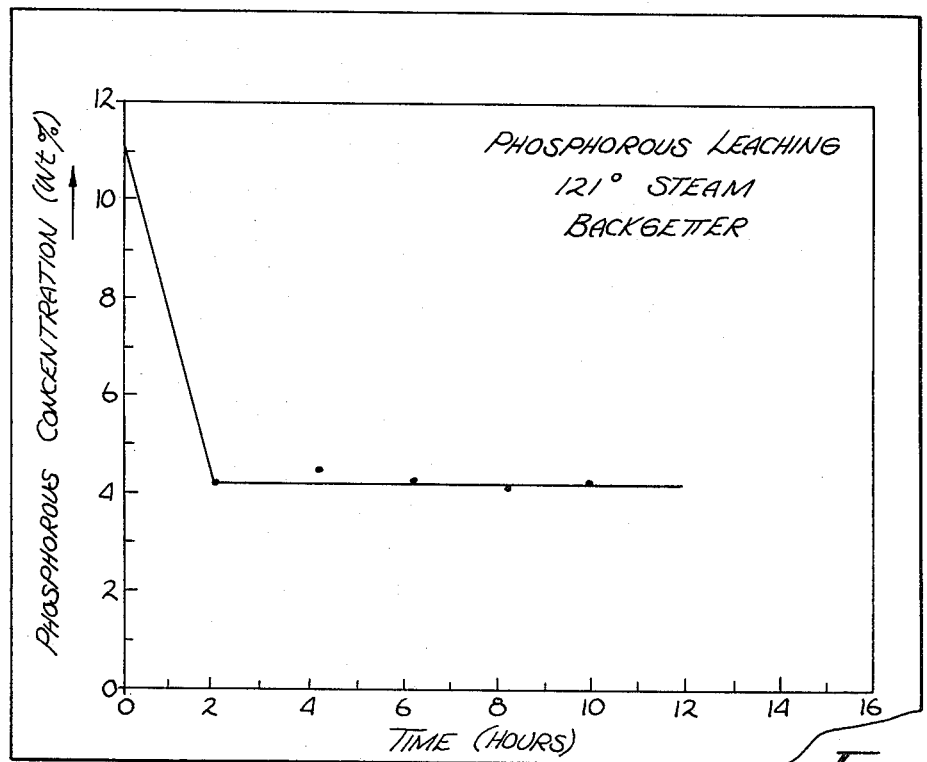
Figure 3C:
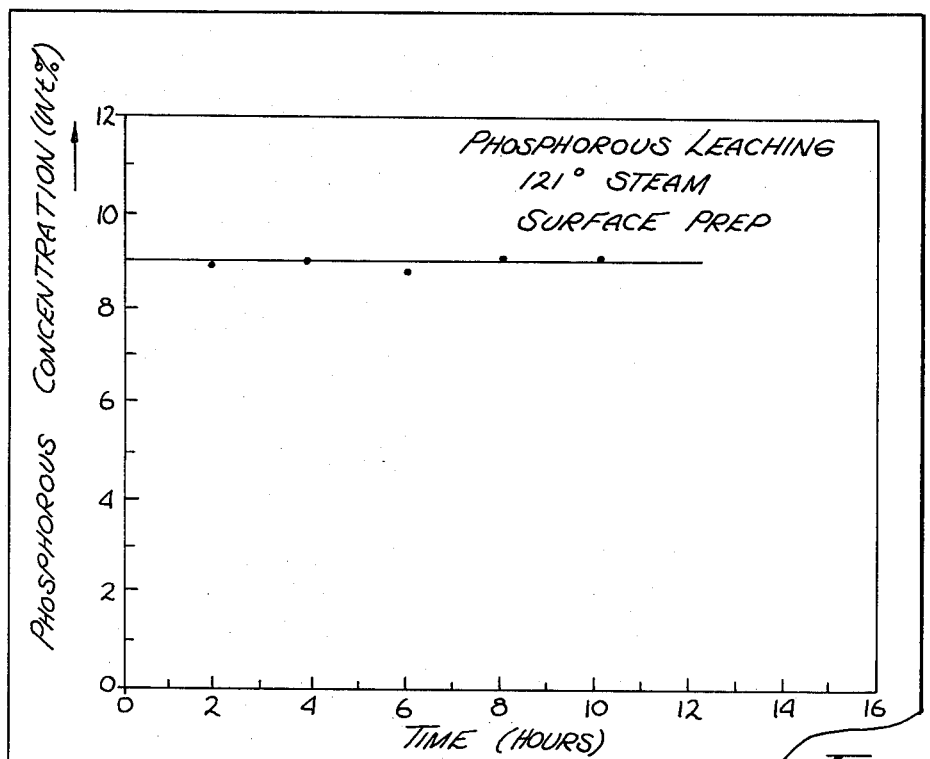
Figure 3D:
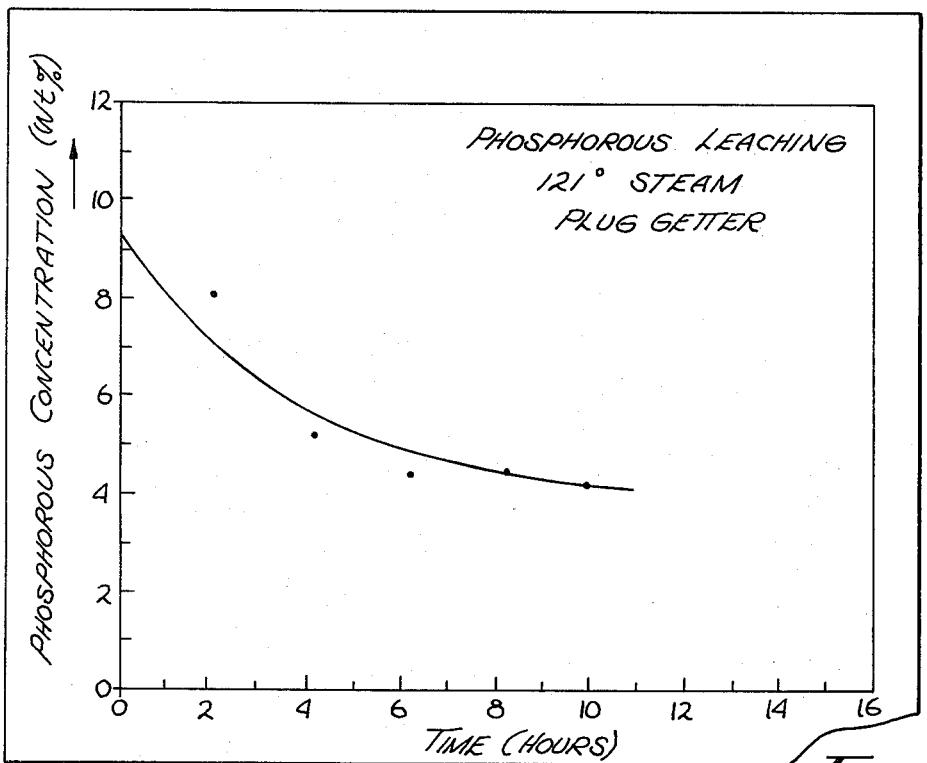
Figure 3E:
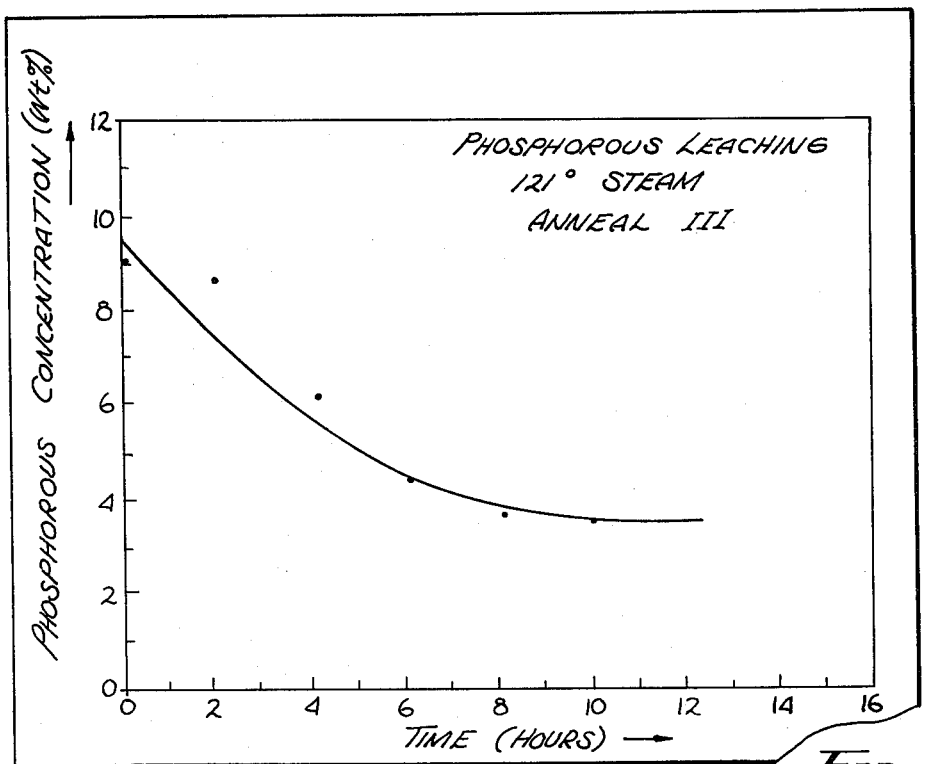

As disclosed in FIG. 3b, the effect of the backgetter cycle is to reduce the lower limit of phosphorus concentration to about 4% by weight versus about 1% by weight for undensified pyroglass as shown in FIG. 3a. In addition, it will be noted that the removal of phosphorus from the pyroglass essentially ceases after two hours in the steam environment, if the steam leaching process is effectuated immediately after the backgetter cycle. As shown in FIG. 3c, the effect of steam leaching on the pyroglass layer 12 after the surface prep cycle effectively stabilizes the concentration of phosphorus within the pyroglass in that substantially no loss of phosphorus after 12 hours within the steam environment occurred. It will be appreciated, that this stability is desirable from a corrosion standpoint inasmuch as the phosphorus would be unable to react and form phosphoric acid within the package cavity. As shown in FIGS. 3d and 3e, the plug-getter cycle and subsequent anneal cycle causes phosphorus to be leached under the above described steam conditions. Thus, the stability of the surface prep process has been negated due to the plug-getter step. However, it will be noted that the phosphorus loss over time is somewhat slower than for pyroglass that has not been given a surface prep cycle. In addition, it will be noted from the graphs that the minimum phosphorus level for steam leach pyroglass after either a plug-getter or anneal cycles approaches approximately 4%. In practice, it has been found that in order to preclude metallization corrosion problems in the packaged device 10, that the phosphorus concentration of the pyroglass layer 12 should lie within a desirable range of 4–6% by weight. Moreover, it has been determined that the relatively low temperatures involved in the above described steam leaching process does not cause oxidation of exposed contacts, or any undesirable diffusion of dopants within the silicon wafer of the device 10.

Figure 3F:
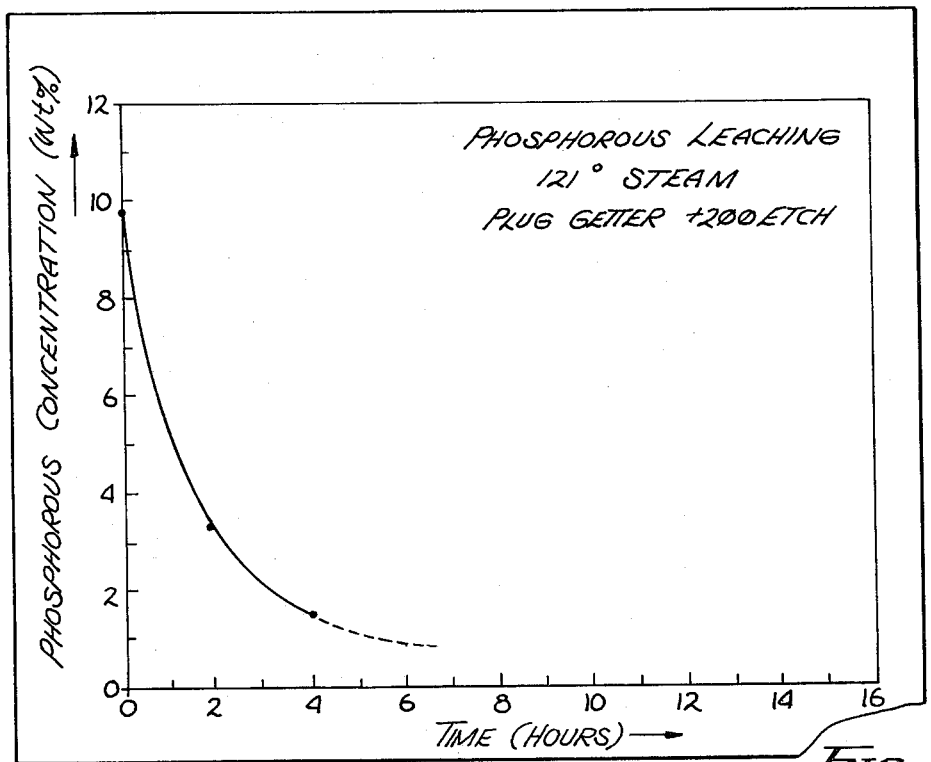

Referring now to FIG. 3f, the effect of immersing the semiconductor device 10 after the plug-getter step in an etch dip for approximately 120 seconds is disclosed. The etching solution removes pyroglass which may have formed in the passages 19 during the plug-getter cycle. As illustrated, the effect of the etch dip after the plug-getter cycle accelerates the leach out of phosphorus during the subsequent steam exposure. In fact, wafers receiving more than one hour of steam exposure had only 3.5% phosphorus or less remaining in the pyroglass layer 12. However, as would be expected, these wafers suffered cracking and crazing of the pyroglass after the high temperature anneal cycle. Thus, the above results would indicate that the proper place for implementing the present invention's use of steam leaching would be after the high temperature annealing step has been completed.

In summary, it has been found that steam leaching at 121° C. and 2 atm. pressure for approximately two hours is suitable for removal of phosphorus from heavily doped pyroglass. In fact, devices with 5% phosphorus and reflowed contacts were achieved in the experimental setup described above. However, it will be apparent that the specific temperatures, pressures and exposure time for any given semiconductor device may be varied in order to optimize the steam leaching process of the present invention. For example, depending on the thickness and initial phosphorus content of the pyroglass layer, prolonged or shortened exposure within the steam environment may be required in order to satisfactorily lower the phosphorus concentration in the pyroglass.

Thus, a method for removing phosphorus from phosphosilicate glass has been disclosed. The method is simple, inexpensive, and has particular application in semiconductor fabrication. Although the method has been described with reference to FIGS. 1-3, it will be appreciated that the figures are for illustration only and that the present invention may be used in any application where it is desired that phosphorus be leached for pyroglass or the like.

I claim:

1. A process for reducing the phosphorus concentration in a phosphosilicate glass, comprising the steps of:
   providing a steam environment;
   adjusting the temperature of said environment, such that said temperature lies within a predetermined range;
   adjusting the pressure within said environment, such that said pressure lies within a predetermined range;
   inserting said phosphosilicate glass into said environment;
   removing said glass from said environment once a desired amount of phosphorus has been leached from said glass;
   whereby the concentration of phosphorus in said glass is reduced.

2. The process as defined by claim 1 wherein said pressure lies generally within the range of 1.5-2.5 atm.

3. The process as defined by claim 2 wherein said temperature lies generally within the range of 115°-125° C.

4. The process as defined by claim 3 wherein said glass is maintained within said environment for a predetermined time.

5. The process as defined by claim 4 wherein said predetermined time is 2 hours.

6. A process for reducing the phosphorus concentration of a phosphosilicate glass deposited on a surface of an semiconductor device, comprising the steps of:
   providing a steam environment;
   adjusting the temperature of said environment, such that said temperature lies within a predetermined range;
   adjusting the pressure of said environment, such that said pressure lies within a predetermined range;
   inserting said semiconductor device into said environment;
   removing said semiconductor device from said environment after a predetermined time;
   whereby the concentration of said phosphorus in said glass may be reduced to a desired level.

7. The process or defined by claim 6 wherein said temperature lies generally within the range of 115°-125° C.

8. The process as defined by claim 7 wherein said pressure lies generally within the range of 1.5-2.5 Atm.

9. The process as defined by claim 8 wherein said predetermined time lies generally within the range of 1-3 hours.

10. The process as defined by claim 9 wherein said phosphorus in said glass concentration is lowered below 6%.

11. A process for reducing the phosphorus concentration of a phosphosilicate glass deposited on a surface of a semiconductor device, comprising the steps of:
    providing a steam environment;
    adjusting the temperature of said steam environment such that said temperature lies generally within the range of 115°-125° C.;
    adjusting the pressure in said environment such that said pressure lies generally within the range of 1.5-2.0 atm;
    inserting said semiconductor into said environment;
    removing said semiconductor device from said environment after a predetermined time;
    whereby the concentration of said phosphorus in said glass is reduced.

12. The process as defined by claim 11 wherein said predetermined time lies within the range of 1-3 hours.

13. The process as defined by claim 12 wherein said process is effectuated after said glass has been flowed on said semiconductor device.

* * * * *